(12) United States Patent
Hanano et al.

(10) Patent No.: US 11,034,860 B2
(45) Date of Patent: Jun. 15, 2021

(54) POLISHING AGENT, STOCK SOLUTION FOR POLISHING AGENT, AND POLISHING METHOD

(71) Applicant: HITACHI CHEMICAL COMPANY, LTD., Tokyo (JP)

(72) Inventors: Masayuki Hanano, Tokyo (JP); Kouji Mishima, Tokyo (JP); Naomi Watanabe, Tokyo (JP)

(73) Assignee: SHOWA DENKO MATERIALS CO., LTD., Tokyo (JP)

( * ) Notice: Subject to any disclaimer, the term of this patent is extended or adjusted under 35 U.S.C. 154(b) by 0 days.

(21) Appl. No.: 16/493,409

(22) PCT Filed: Mar. 2, 2018

(86) PCT No.: PCT/JP2018/008133
§ 371 (c)(1),
(2) Date: Sep. 12, 2019

(87) PCT Pub. No.: WO2018/168534
PCT Pub. Date: Sep. 20, 2018

(65) Prior Publication Data
US 2020/0017718 A1    Jan. 16, 2020

(30) Foreign Application Priority Data

Mar. 14, 2017  (JP) .............................. JP2017-048555

(51) Int. Cl.
*C09G 1/02*    (2006.01)
*C09K 3/14*    (2006.01)
*H01L 21/3105*    (2006.01)

(52) U.S. Cl.
CPC .............. *C09G 1/02* (2013.01); *C09K 3/1409* (2013.01); *H01L 21/31053* (2013.01)

(58) Field of Classification Search
None
See application file for complete search history.

(56) References Cited

U.S. PATENT DOCUMENTS

| | | | |
|---|---|---|---|
| 4,944,836 A | 7/1990 | Beyer et al. | |
| 9,080,080 B2 * | 7/2015 | Yoneda | C09G 1/02 |
| 2005/0037693 A1 * | 2/2005 | Uchikura | C09G 1/02 |
| | | | 451/41 |
| 2010/0248593 A1 * | 9/2010 | Sakai | C03C 19/00 |
| | | | 451/36 |
| 2012/0094491 A1 * | 4/2012 | Kanamaru | H01L 21/3212 |
| | | | 438/693 |

FOREIGN PATENT DOCUMENTS

| | | |
|---|---|---|
| JP | 2014-022511 A | 2/2014 |
| JP | 2015-189898 A | 11/2015 |
| WO | 2011/021599 A1 | 2/2011 |

* cited by examiner

*Primary Examiner* — Shamim Ahmed
(74) *Attorney, Agent, or Firm* — Fitch, Even, Tabin & Flannery, L.L.P.

(57) ABSTRACT

A polishing agent containing abrasive grains and water, in which the abrasive grains contain silica particles, an average particle diameter $R_{ave}$ of the abrasive grains is 50 nm or more, a ratio $R_{ave}/R_{min}$ of the average particle diameter $R_{ave}$ to an average minor diameter $R_{min}$ of the abrasive grains is 1.0 to 2.0, and a zeta potential of the abrasive grains in the polishing agent is positive.

22 Claims, No Drawings

POLISHING AGENT, STOCK SOLUTION FOR POLISHING AGENT, AND POLISHING METHOD

CROSS-REFERENCE TO RELATED APPLICATIONS

This application is a U.S. national phase application filed under 35 U.S.C. § 371 of International Application No. PCT/JP2018/008133, filed Mar. 2, 2018, designating the United States, which claims priority from Japanese Patent Application No. 2017-048555, filed Mar. 14, 2017, which are hereby incorporated herein by reference in their entirety.

TECHNICAL FIELD

The present invention relates to a polishing agent, a stock solution for the polishing agent, and a polishing method.

BACKGROUND ART

In the field of production of semiconductors, with achievement of high performance of ultra LSI devices, a miniaturization technology as an extension of the conventional technology finds restriction in allowing high integration and speed-up to be compatible with each other. In this regard, while miniaturization of semiconductor elements is being promoted, techniques for allowing vertical high integration, namely, techniques for multi-layering of a wiring have been developed (for example, see Patent Literature 1 described below).

In the process for producing a device in which wirings are multi-layered, one of the most important techniques is a CMP technique. The CMP technique is a technique for forming a thin film on a substrate by chemical vapor deposition (CVD), physical vapor deposition (PVD), or the like, and then flattening the surface thereof. For example, a flattening treatment by the CMP is essential to ensure a focal depth in lithography. When the substrate surface has irregularities, there occur, for example, such troubles that the focusing in an exposure step is precluded, or a fine wiring structure cannot be sufficiently formed. Further, the CMP technique is also applied, in a production process of a device, to a step of forming an element isolation region by polishing an insulating film such as a plasma oxide film (such as p-TEOS, p-$SiH_4$, BPSG, or HDP-$SiO_2$) or an application type oxide film (such as SOD or HSG), a step of forming an interlayer insulating film, or a step of flattening a plug or a wiring (for example, Al, Cu, W, Ti, Ta, Co, Ru, Mn, and nitrides thereof) after embedding an insulating film in a metal wiring.

CITATION LIST

Patent Literature

Patent Literature 1: U.S. Pat. No. 4,944,836

SUMMARY OF INVENTION

Technical Problem

Incidentally, as a silicon oxide film to be polished, a TEOS film obtained by using tetraethoxysilane (hereinafter, referred to as TEOS) is exemplified, but depending on purposes, as a silicon oxide film having higher denseness than the TEOS film, a $SiH_4$ film obtained by using monosilane (hereinafter, referred to as $SiH_4$) is used in some cases. However, in techniques of the related arts, it is difficult to remove the TEOS film and the $SiH_4$ film at a high polishing rate.

The present invention is directed to solve the above-described problems, and an object thereof is to provide a polishing agent capable of removing a TEOS film and a $SiH_4$ film at a high polishing rate. In addition, another object of the present invention is to provide a stock solution for a polishing agent for obtaining the above-described polishing agent. Furthermore, still another object of the present invention is to provide a polishing method using the above-described polishing agent.

Solution to Problem

The present inventors have conducted intensive studies, and as a result, found that the above-described problems can be solved by using specific abrasive grains.

A polishing agent of the present invention is a polishing agent containing abrasive grains and water, in which the abrasive grains contain silica particles, an average particle diameter $R_{ave}$ of the abrasive grains is 50 nm or more, a ratio $R_{ave}/R_{min}$ of the average particle diameter $R_{ave}$ to an average minor diameter $R_{min}$ of the abrasive grains is 1.0 to 2.0, and a zeta potential of the abrasive grains in the polishing agent is positive.

According to the polishing agent of the present invention, the TEOS film and the $SiH_4$ film can be removed at a high polishing rate.

The silica particles preferably contain colloidal silica. In this case, polishing scratches can be easily reduced while keeping a high polishing rate for the TEOS film.

The average particle diameter $R_{ave}$ is preferably 50 to 100 nm. In addition, the average particle diameter $R_{ave}$ preferably exceeds 60 nm.

The ratio $R_{ave}/R_{min}$ is preferably 1.0 to 1.7. In this case, a high polishing rate for the $SiH_4$ film can be easily obtained.

The polishing agent of the present invention may contain a pH adjusting agent. In this case, a pH of the polishing agent can be easily adjusted to an optimal value.

A pH of the polishing agent of the present invention is preferably 2.0 to 4.0. In this case, a further favorable polishing rate for the TEOS film is obtainable, and the aggregation of the abrasive grains is suppressed so that favorable dispersion stability of the abrasive grains is obtainable.

A stock solution for a polishing agent of the present invention is a stock solution for a polishing agent for obtaining the polishing agent of the present invention, in which the stock solution is diluted with water to obtain the above-described polishing agent. In this case, it is possible to reduce the cost, the space, and the like necessary for transportation, storage, and the like of the polishing agent.

A polishing method of the present invention includes a step of polishing and removing at least a part of a silicon oxide film by using the polishing agent of the present invention or a polishing agent obtained by diluting the stock solution for a polishing agent of the present invention with water. According to the polishing method of the present invention, the silicon oxide film can be removed at a high polishing rate. The silicon oxide film may include at least one selected from the group consisting of a TEOS film and a $SiH_4$ film.

Advantageous Effects of Invention

According to the present invention, it is possible to provide a polishing agent capable of removing a TEOS film and a SiH$_4$ film at a high polishing rate. In addition, according to the present invention, it is possible to provide a stock solution for a polishing agent for obtaining the above-described polishing agent. Furthermore, according to the present invention, it is possible to provide a polishing method using the above-described polishing agent. According to the present invention, it is possible to provide an use of the polishing agent to polishing of a silicon oxide film. According to the present invention, it is possible to provide an use of the polishing agent to polishing of a silicon oxide film including at least one selected from the group consisting of a TEOS film and a SiH$_4$ film.

DESCRIPTION OF EMBODIMENTS

Definition

In the present specification, the term "step" includes not only an independent step but also a step by which an intended action of the step is achieved, though the step cannot be clearly distinguished from other steps.

In the present specification, the range "to" indicates the range that includes the numerical values which are described before and after "to", as the minimum value and the maximum value, respectively. In the numerical ranges that are described stepwise in the present specification, the upper limit value or the lower limit value of the numerical range of a certain stage may be replaced with the upper limit value or the lower limit value of the numerical range of another stage. In the numerical ranges that are described in the present specification, the upper limit value or the lower limit value of the numerical value range may be replaced with the value shown in the examples.

In the present specification, "A or B" may include either one of A and B, and may also include both of A and B.

In the present specification, when a plurality of substances corresponding to each component exist in the composition, the content of each component in the composition means the total amount of the plurality of substances that exist in the composition, unless otherwise specified.

In the present specification, "polishing rate (Removal Rate)" means a rate at which the material to be polished is removed per unit time.

In the present specification, when the polishing agent is obtained by adding water or the like to the stock solution for the polishing agent, "to dilute stock solution for polishing agent to X times" means such dilution that the mass of the polishing agent is X times the mass of the stock solution for the polishing agent. For example, obtaining the polishing agent by adding water having the same mass as the mass of the stock solution for the polishing agent is defined as an operation of diluting the stock solution for the polishing agent to twice.

Hereinafter, an embodiment of the present invention will be described.

<Polishing Agent>

A polishing agent of the present embodiment (hereinafter, simply referred to as "polishing agent" in some cases) is a composition which comes in contact with a surface to be polished at the time of polishing, and is, for example, a polishing agent for CMP.

The polishing agent of the present embodiment is a polishing agent containing abrasive grains and water, in which the abrasive grains contain silica particles, an average particle diameter R$_{ave}$ of the abrasive grains is 50 nm or more, a ratio R$_{ave}$/R$_{min}$ of the average particle diameter R$_{ave}$ to an average minor diameter R$_{min}$ of the abrasive grains is 1.0 to 2.0, and a zeta potential of the abrasive grains in the polishing agent is positive. For example, the polishing agent of the present embodiment is a polishing agent for polishing a silicon oxide film (for example, a silicon oxide film in a base substrate having a silicon oxide film) such as a TEOS film or a SiH$_4$ film and can remove at least a part of the silicon oxide film by polishing the silicon oxide film. The polishing agent of the present embodiment may be used for polishing a metallic material (for example, a wiring metal such as a copper-based metal, a cobalt-based metal, or a ruthenium-based metal; a barrier metal such as a tantalum-based metal, a titanium-based metal, or a manganese-based metal) along with the silicon oxide film.

Hereinafter, components and the like that are contained in the polishing agent of the present embodiment will be described in detail.

(Abrasive Grains)

The polishing agent of the present embodiment contains abrasive grains containing silica particles. The silica particles are particles containing silica. The content of silica in the silica particles may be 50% by mass or more, 70% by mass or more, 90% by mass or more, 95% by mass or more, or 98% by mass or more on the basis of the total amount of the silica particles. The silica particles may be particles composed of silica (particles in which 100% by mass of particles is substantially silica).

The silica particles preferably contain at least one selected from the group consisting of colloidal silica, fumed silica, and modified substances thereof, from the viewpoint that polishing scratches can be easily reduced while keeping a high polishing rate for an insulating film, and more preferably contain colloidal silica. As the colloidal silica, commercialized products are easily available.

Examples of the modified substances include materials in which surfaces of particles containing a hydroxide of silica or the like have been modified with an alkyl group, and composite particles in which surfaces of particles have other particles attached thereto. A method of modifying the surfaces of the particles with an alkyl group is not particularly limited, but examples thereof include a method of causing a hydroxyl group which exists on the surfaces of the particles to react with an alkoxysilane having an alkyl group. The alkoxysilane having an alkyl group is not particularly limited, but examples thereof include monomethyltrimethoxysilane, dimethyldimethoxysilane, trimethylmonomethoxysilane, monoethyltrimethoxysilane, diethyldimethoxysilane, triethylmonomethoxysilane, monomethyltriethoxysilane, dimethyldiethoxysilane, and trimethylmonoethoxysilane. The reaction method is not particularly limited, but for example, reaction may be conducted in a polishing agent (a polishing agent at room temperature, or the like) containing particles and alkoxysilane, and heating may be conducted in order to accelerate the reaction.

The average particle diameter R$_{ave}$ of the abrasive grains is 50 nm or more and the ratio R$_{ave}$/R$_{min}$ of the average particle diameter R$_{ave}$ to the average minor diameter R$_{min}$ of the abrasive grains is 1.0 to 2.0. When the average particle diameter R$_{ave}$ is 50 nm or more, a SiH$_4$ film can be removed at a high polishing rate. In addition, when the ratio R$_{ave}$/R$_{min}$ is 2.0 or less, a SiH$_4$ film can be removed at a high polishing rate.

The average particle diameter R$_{ave}$ of the abrasive grains is preferably more than 50 nm, more preferably 55 nm or more, further preferably more than 55 nm, particularly preferably 60 nm or more, extremely preferably more than 60 nm, very preferably 70 nm or more, still further preferably more than 70 nm, further preferably 80 nm or more, and particularly preferably more than 80 nm, from the viewpoint of easily obtaining a sufficient mechanical polishing force and obtaining a further higher polishing rate for a TEOS film. The average particle diameter $R_{ave}$ of the abrasive grains is preferably 300 nm or less, more preferably 250 nm or less, further preferably 200 nm or less, particularly preferably 150 nm or less, extremely preferably 120 nm or less, and very preferably 100 nm or less, from the viewpoint of obtaining favorable dispersion stability of the abrasive grains in the polishing agent and the viewpoint that the number of polishing scratches generated by polishing is further smaller. From the above viewpoints, the average particle diameter $R_{ave}$ of the abrasive grains is preferably 50 to 300 nm, more preferably 50 to 120 nm, and further preferably 50 to 100 nm.

The "average particle diameter" of the abrasive grains means an average secondary particle diameter of the abrasive grains. The average particle diameter means a value of an average particle diameter (median diameter of volume distribution, cumulative median value) obtained by measuring the polishing agent with a dynamic light scattering type particle size distribution meter (for example, trade name: COULTER N4SD manufactured by Coulter Electronics, Inc.).

Specifically, the average particle diameter can be measured by the following procedure. First, approximately 100 µL (L represents liter, hereinafter the same) of the polishing agent is measured out and diluted with ion-exchanged water such that the content of the abrasive grains becomes approximately 0.05% by mass (content in which transmissivity (H) at the time of measurement is 60 to 70%), to obtain a diluted solution. Then, the diluted solution is charged into a sample tank of the dynamic light scattering type particle size distribution meter, and it can be measured through a read-out value which is displayed as an average particle diameter.

The average minor diameter $R_{min}$ can be measured by a known transmission electron microscope (for example, trade name: H-7100FA manufactured by Hitachi, Ltd.). For example, the minor diameter is the shortest distance among distances connecting end parts of images of particles for images of particles (which each are one independent primary particle) obtained by capturing images of the abrasive grains using the transmission electron microscope. The average minor diameter $R_{min}$ is an average value of a predetermined number of minor diameters, and in the case of using colloidal silica as the abrasive grains, since the particle diameters are generally uniform, the number of particles to be measured may be about ten particles.

The $R_{ave}/R_{min}$ is preferably in the following ranges from the viewpoint of obtaining a further favorable polishing rate for a SiH$_4$ film. The $R_{ave}/R_{min}$ is preferably 1.0 or more and more preferably 1.1 or more. The $R_{ave}/R_{min}$ is preferably 1.9 or less, more preferably 1.7 or less, further preferably 1.5 or less, and particularly preferably 1.3 or less. From these viewpoints, the $R_{ave}/R_{min}$ is preferably 1.0 to 1.9, more preferably 1.0 to 1.7, further preferably 1.1 to 1.5, particularly preferably 1.1 to 1.3.

The standard deviation of the average particle size distribution in the abrasive grains is preferably 10 nm or less and more preferably 5 nm or less. In the measurement of the standard deviation of the average particle size distribution, for example, the abrasive grains in the polishing agent are charged into COULTER N4SD manufactured by Coulter Electronics, Inc., and a value of the standard deviation can be obtained from the chart of the particle size distribution.

The abrasive grains have a positive zeta potential in the polishing agent. By using the abrasive grains having a positive charge in the polishing agent (for example, a polishing agent having a pH of 2.0 to 4.0), since the abrasive grains act electrostatically on a TEOS film, the polishing rate for the TEOS film is considered to easily increase.

It can be determined whether or not the abrasive grains have a positive charge in the polishing agent by measuring a zeta potential of the abrasive grains in the polishing agent. In a case where the zeta potential of the abrasive grains in the polishing agent is measured and the numerical value exceeds 0 mV, it can be determined that the abrasive grains have a positive charge.

The zeta potential can be measured, for example, with trade name: DELSA NANO C manufactured by Beckman Coulter, Inc. The zeta potential ($\zeta$ [mV]) can be measured by the following procedure. First, a sample is obtained by diluting the polishing agent with pure water in a zeta potential measurement apparatus such that the scattering intensity of a measurement sample becomes $1.0 \times 10^4$ to $5.0 \times 10^4$ cps (here, "cps" means counts per second, which is a unit of the number of particles counted). Then, the sample is placed in a cell for measuring the zeta potential, and the zeta potential is measured. In order to adjust the scattering intensity to the above-described range, for example, the polishing agent is diluted such that the content of the abrasive grains is adjusted to 1.7 to 1.8% by mass.

The lower limit of the zeta potential of the abrasive grains is preferably 1 mV or more, more preferably 5 mV or more, further preferably 10 mV or more, and particularly preferably 13 mV or more, from the viewpoint of obtaining a further higher polishing rate for a TEOS film. The upper limit of the zeta potential of the abrasive grains is not particularly limited, but may be 100 mV or less, 50 mV or less, 30 mV or less, or 20 mV or less. From these viewpoints, the zeta potential of the abrasive grains is preferably 1 to 50 mV.

The content of the abrasive grains is preferably 0.01% by mass or more, more preferably 0.1% by mass or more, further preferably 0.5% by mass or more, particularly preferably 1% by mass or more, extremely preferably 3% by mass or more, and very preferably 5% by mass or more on the basis of the total mass of the polishing agent, from the viewpoint of easily obtaining a sufficient mechanical polishing force and obtaining further higher polishing rates for a TEOS film and a SiH$_4$ film. The content of the abrasive grains is preferably 20% by mass or less, more preferably 15% by mass or less, further preferably 10% by mass or less, and particularly preferably 8% by mass or less on the basis of the total mass of the polishing agent, from the viewpoint of easily avoiding an increase in viscosity of the polishing agent, the viewpoint of easily avoiding the aggregation of the abrasive grains, the viewpoint of easily reducing polishing scratches, the viewpoint of easily handling the polishing agent, and the like. From these viewpoints, the content of the abrasive grains is preferably 0.01 to 20% by mass, more preferably 1 to 15% by mass, further preferably 3 to 10% by mass, and particularly preferably 5 to 10% by mass on the basis of the total mass of the polishing agent.

(Water)

The polishing agent of the present embodiment contains water. The water can be used as a dispersion medium of other components or as a solvent. As for the water, in order to prevent the inhibition of the action of other components, it is preferable that the water does not contain impurities as much as possible. Specifically, as for the water, the water is preferably at least one selected from the group consisting of pure water, ultrapure water, and distilled water as water from which impurity ions are removed by an ion-exchange resin and then foreign substances are removed through a filter.

(pH of Polishing Agent and pH Adjusting Agent)

The pH of the polishing agent of the present embodiment is preferably less than 7.0, more preferably 6.0 or less, further preferably less than 6.0, particularly preferably 5.0 or less, extremely preferably less than 5.0, very preferably 4.0 or less, still further preferably less than 4.0, further preferably 3.8 or less, particularly preferably 3.5 or less, and extremely preferably 3.0 or less, from the viewpoint of obtaining a further favorable polishing rate for a TEOS film and the viewpoint of suppressing the aggregation of the abrasive grains and obtaining favorable dispersion stability of the abrasive grains. The pH of the polishing agent is preferably 2.0 or more, more preferably 2.3 or more, and further preferably 2.5 or more, from the viewpoint of being excellent in handling in a safety aspect and the viewpoint of easily obtaining a sufficient mechanical polishing force and further improving a polishing rate for a TEOS film. Form these viewpoints, the pH of the polishing agent is preferably 2.0 or more and less than 7.0, more preferably 2.0 to 5.0, and further preferably 2.0 to 4.0. The pH is defined as a pH at a liquid temperature of 25° C.

The pH of the polishing agent can be measured by a pH meter which uses a general glass electrode. Specifically, for example, trade name: Model (F-51) manufactured by HORIBA, Ltd. can be used. For example, a measurement value of pH can be obtained by, after 3-point calibration of a pH meter using a pH standard solution (pH: 4.01) of a phthalate, a pH standard solution (pH: 6.86) of a neutral phosphate, and a pH standard solution (pH: 9.18) of a borate as pH standard solutions, putting an electrode of the pH meter in the polishing agent, and measuring a value at the time after 2 min or longer elapsed and the pH became stable. At this time, the liquid temperatures of the pH standard solution and the polishing agent are, for example, 25° C.

The polishing agent of the present embodiment may contain a pH adjusting agent (pH adjusting agent component). By using the pH adjusting agent, the pH of the polishing agent can be easily adjusted. Examples of the pH adjusting agent include acid components (acid components); and base components (for example, base components such as KOH and ammonia). As the pH adjusting agent, a chelating agent described below can be used.

(Additive)

The polishing agent of the present embodiment can contain an additive as a component other than the abrasive grains and water. The additive can be used for the purposes of improving the dispersibility of the abrasive grains in the polishing agent, improving the chemical stability of the polishing agent, improving the polishing rate, and the like. Examples of the additive include a chelating agent (chelating agent component), a corrosion preventive agent, an oxidizing agent, an organic solvent, a surfactant, and an antifoaming agent.

[Chelating Agent]

The chelating agent can improve polishing rates for a wiring metal and a barrier metal in addition to the effect as the pH adjusting agent. As the chelating agent, from the viewpoint of improving polishing rates for a wiring metal and a barrier metal, at least one acid component selected from the group consisting of an organic acid component and an inorganic acid component is preferable.

Examples of the organic acid components include organic acids (excluding amino acid), organic acid esters, organic acid salts, and amino acids. Examples of the organic acids include formic acid, acetic acid, propionic acid, butyric acid, valeric acid, 2-methylbutyric acid, n-hexanoic acid, 3,3-dimethylbutyric acid, 2-ethylbutyric acid, 4-methylpentanoic acid, n-heptanoic acid, 2-methylhexanoic acid, n-octanoic acid, 2-ethylhexanoic acid, benzoic acid, glycolic acid, salicylic acid, glyceric acid, oxalic acid, malonic acid, succinic acid, 3-methylphthalic acid, 4-methylphthalic acid, 3-aminophthalic acid, 4-aminophthalic acid, 3-nitrophthalic acid, 4-nitrophthalic acid, glutaric acid, adipic acid, pimelic acid, maleic acid, phthalic acid, isophthalic acid, malic acid, tartaric acid, citric acid, p-toluenesulfonic acid, p-phenolsulfonic acid, methylsulfonic acid, lactic acid, itaconic acid, quinaldic acid, adipic acid, and pimelic acid. Examples of the organic acid esters include esters of the above-described organic acids. Examples of the organic acid salts include ammonium salts, alkali metal salts, alkaline earth metal salts, and halides of the above-described organic acids. Examples of the amino acids include alanine, arginine, asparagine, aspartic acid, cysteine, glutamine, glutamic acid, glycine, histidine, isoleucine, leucine, lysine, methionine, phenylalanine, proline, serine, threonine, tryptophan, tyrosine, and valine.

Examples of the inorganic acid components include inorganic acids, ammonium salts of the inorganic acids, ammonium persulfate, ammonium nitrate, ammonium chloride, and chromic acids. Examples of the inorganic acids include hydrochloric acid, sulfuric acid, and nitric acid.

In a case where an object to be polished (a substrate to be polished or the like) is, for example, a silicon substrate containing an element for an integrated circuit, contamination with an alkali metal, an alkaline earth metal, a halide, or the like is undesirable, and accordingly, the salt of the above-described acid component is preferably a salt other than the alkali metal salt, the alkaline earth metal salt, and the halide.

The chelating agent is preferably at least one selected from the group consisting of acetic acid, malonic acid, malic acid, tartaric acid, citric acid, salicylic acid, adipic acid, phthalic acid, glycolic acid, and succinic acid, from the viewpoint of effectively suppressing an etching rate while keeping a practical polishing rate. The chelating agent can be used singly or in combination of two or more kinds thereof.

The content of the chelating agent is preferably 0.001% by mass or more, more preferably 0.002% by mass or more, further preferably 0.005% by mass or more, particularly preferably 0.01% by mass or more, extremely preferably 0.05% by mass or more, and very preferably 0.1% by mass or more on the basis of the total mass of the polishing agent, from the viewpoint of being capable of obtaining further favorable polishing rates for the wiring metal and the barrier metal. The content of the chelating agent is preferably 20% by mass or less, more preferably 10% by mass or less, and further preferably 5% by mass or less on the basis of the total mass of the polishing agent, from the viewpoint of easily suppressing etching to reduce the roughening of the polished surface.

[Corrosion Preventive Agent]

The polishing agent of the present embodiment may contain a corrosion preventive agent (corrosion preventive agent component, metal corrosion preventive agent). By forming a protective film on a wiring metal (copper-based metal, cobalt-based metal, or the like), the corrosion preventive agent can easily suppress the etching of the wiring metal to reduce the roughening of the polished surface.

The corrosion preventive agent is not particularly limited and it is possible to use any conventionally known component as a compound having a corrosion preventive effect against a metallic material. As the corrosion preventive agent, specifically, it is possible to use at least one selected from the group consisting of a triazole compound, a pyridine compound, a pyrazole compound, a pyrimidine compound, an imidazole compound, a guanidine compound, a thiazole compound, a tetrazole compound, a triazine compound, and hexamethylenetetramine Here, the term "compound" is a collective term for compounds having a skeleton thereof, and for example, the "triazole compound" means a compound having a triazole skeleton. The corrosion preventive agent can be used singly or in combination of two or more kinds thereof.

Examples of the triazole compound include 1,2,3-triazole, 1,2,4-triazole, 3-amino-1H-1,2,4-triazole, benzotriazole (BTA), 1-hydroxybenzotriazole, 1-dihydroxypropylbenzotriazole, 2,3-dicarboxypropylbenzotriazole, 4-hydroxybenzotriazole, 4-carboxy-1H-benzotriazole, 4-carboxy-1H-benzotriazole methyl ester (methyl 1H-benzotriazole-4-carboxylate), 4-carboxy-1H-benzotriazole butyl ester (butyl 1H-benzotriazole-4-carboxylate), 4-carboxy-1H-benzotriazole octyl ester (octyl 1H-benzotriazole-4-carboxylate), 5-hexylbenzotriazole, (1,2,3-benzotriazolyl-1-methyl) (1,2, 4-triazolyl-1-methyl) (2-ethylhexyl)amine, tolyltriazole, naphthotriazole, bis[(1-benzotriazolyl)methyl]phosphonic acid, 3H-1,2,3-triazolo[4,5-b]pyridin-3-ol, 1H-1,2,3-triazolo[4,5-b]pyridine, 1-acetyl-1H-1,2,3-triazolo[4,5-b]pyridine, 3-hydroxypyridine, 1,2,4-triazolo[1,5-a]pyrimidine, 1,3,4,6,7,8-hexahydro-2H-pyrimido[1,2-a]pyrimidine, 2-methyl-5,7-diphenyl-[1,2,4]triazolo[1,5-a]pyrimidine, 2-methylsulfanyl-5,7-diphenyl-[1,2,4]triazolo[1,5-a]pyrimidine, and 2-methylsulfanyl-5,7-diphenyl-4,7-dihydro-[1,2, 4]triazolo[1,5-a]pyrimidine. Incidentally, the compounds having a triazole skeleton and another skeleton in one molecule are classified into the triazole compound.

Examples of the pyridine compound include pyridine, 8-hydroxyquinoline, protionamide, 2-nitropyridin-3-ol, pyridoxamine, nicotinamide, iproniazid, isonicotinic acid, benzo[f]quinoline, 2,5-pyridinedicarboxylic acid, 4-styrylpyridine, anabasine, 4-nitropyridin-1-oxide, ethyl 3-pyridylacetate, quinoline, 2-ethylpyridine, quinolinic acid, arecoline, citrazinic acid, pyridin-3-methanol, 2-methyl-5-ethylpyridine, 2-fluoropyridine, pentafluoropyridine, 6-methylpyridin-3-ol, and ethyl 2-pyridylacetate.

Examples of the pyrazole compound include pyrazole, 1-allyl-4.0-dimethylpyrazole, 4.0-di(2-pyridyl)pyrazole, 4.0-diisopropylpyrazole, 4.0-dimethyl-1-hydroxymethylpyrazole, 4.0-dimethyl-1-phenylpyrazole, 4.0-dimethylpyrazole, 3-amino-5-hydroxypyrazole, 4-methylpyrazole, N-methylpyrazole, and 3-aminopyrazole.

Examples of the pyrimidine compound include pyrimidine, 1,3-diphenyl-pyrimidine-2,4,6-trione, 1,4,5,6-tetrahydropyrimidine, 2,4,5,6-tetraaminopyrimidine sulfate, 2,4,5-trihydroxypyrimidine, 2,4,6-triaminopyrimidine, 2,4,6-trichloropyrimidine, 2,4,6-trimethoxypyrimidine, 2,4,6-triphenylpyrimidine, 2,4-diamino-6-hydroxylpyrimidine, 2,4-diaminopyrimidine, 2-acetamidopyrimidine, 2-aminopyrimidine, and 4-aminopyrazolo[3,4-d]pyrimidine.

Examples of the imidazole compound include imidazole, 1,1'-carbonylbis-1H-imidazole, 1,1'-oxalyldiimidazole, 1,2, 4,5-tetramethylimidazole, 1,2-dimethyl-5-nitroimidazole, 1,2-dimethylimidazole, 1-(3-aminopropyl)imidazole, 1-butylimidazole, 1-ethylimidazole, 1-methylimidazole, and benzimidazole.

Examples of the guanidine compound include guanidine, 1,1,3,3-tetramethylguanidine, 1,2,3-triphenylguanidine, 1,3-di-o-tolylguanidine, and 1,3-diphenylguanidine.

Examples of the thiazole compound include thiazole, 2-mercaptobenzothiazole, and 2,4-dimethylthiazole.

Examples of the tetrazole compound include tetrazole, 5-methyltetrazole, 5-amino-1H-tetrazole, and 1-(2-dimethylaminoethyl)-5-mercaptotetrazole.

Examples of the triazine compound include triazine and 3,4-dihydro-3-hydroxy-4-oxo-1,2,4-triazine.

The content of the corrosion preventive agent is preferably 0.001% by mass or more, more preferably 0.01% by mass or more, further preferably 0.02% by mass or more, particularly preferably 0.05% by mass or more, and extremely preferably 0.1% by mass or more on the basis of the total mass of the polishing agent, from the viewpoint of being capable of easily suppressing the corrosion of a metallic material and surface roughening. The content of the corrosion preventive agent is preferably 10% by mass or less, more preferably 5.0% by mass or less, and further preferably 0.5% by mass or less on the basis of the total mass of the polishing agent, from the viewpoint of reducing a complex foreign material between the metallic material and the corrosion preventive agent on a polished surface (for example, a polished surface of a substrate).

From the viewpoint of suitably obtaining an effect of easily suppressing etching of a wiring metal to reduce the roughening of the polished surface by forming a protective film to a wiring metal such as copper-based metal or cobalt-based metal, the corrosion preventive agent is preferably at least one selected from the group consisting of a triazole compound, a pyridine compound, an imidazole compound, a tetrazole compound, a triazine compound, and hexamethylenetetramine, and more preferably at least one selected from the group consisting of 3H-1,2,3-triazolo[4, 5-b]pyridin-3-ol, 1-hydroxybenzotriazole, 1H-1,2,3-triazolo[4,5-b]pyridine, benzotriazole, 3-hydroxypyridine, benzimidazole, 5-amino-1H-tetrazole, 3,4-dihydro-3-hydroxy-4-oxo-1,2,4-triazine, and hexamethylenetetramine.

A mass ratio of the content of the chelating agent to the content of the corrosion preventive agent in the polishing agent (the chelating agent/the corrosion preventive agent) is preferably 10/1 to 1/5, more preferably 7/1 to 1/5, further preferably 5/1 to 1/5, and particularly preferably 5/1 to 1/1, from the viewpoint of favorably controlling the etching rate and the polishing rate.

[Oxidizing Agent]

The polishing agent of the present embodiment may contain an oxidizing agent (an oxidizing agent component, a metal oxidizing agent). When the polishing agent contains an oxidizing agent, the polishing rate for the metallic material (a wiring metal, a barrier metal, or the like. For example, a metal layer) can be improved.

In a case where a base substrate provided with an insulating film and a metallic material (for example, a wiring metal such as copper-based metal or cobalt-based metal; or a barrier metal) covered by the insulating film is polished using a polishing agent containing a corrosion preventive agent and an oxidizing agent, the oxidizing agent forms an oxidized film with respect to the metallic material and the corrosion preventive agent forms a protective film on the upper part of the oxidized film, and thus, the metallic material can be adequately polished while sufficiently suppressing the etching of the metallic material. In addition, polishing scratches of the metallic material can be easily suppressed.

The oxidizing agent is not particularly limited, and can be appropriately selected from commonly used oxidizing agents. Specific examples of the oxidizing agent include hydrogen peroxide, peroxosulfate, potassium periodate, hypochlorous acid, and ozone water, and among them, hydrogen peroxide is preferable. Incidentally, a nitric acid that is the above-described acid component has an addition effect as the oxidizing agent. The oxidizing agent can be used singly or in combination of two or more kinds thereof.

The content of the oxidizing agent is preferably 0.01% by mass or more, more preferably 0.05% by mass or more, further preferably 0.1% by mass or more, particularly preferably 0.5% by mass or more, and extremely preferably 1% by mass or more on the basis of the total mass of the polishing agent, from the viewpoint of easily suppressing insufficient oxidation of a metallic material for suppressing the lowering of the polishing rate for the metallic material. The content of the oxidizing agent is preferably 10% by mass or less, more preferably 8% by mass or less, further preferably 5% by mass or less, and particularly preferably 3% by mass or less on the basis of the total mass of the polishing agent, from the viewpoint of being capable of easily suppressing roughening of the polished surface and easily achieving small dishing. Incidentally, in the case of using an oxidizing agent which is generally available as an aqueous solution such as a hydrogen peroxide solution, the content of the oxidizing agent can be adjusted such that the content of the oxidizing agent contained in the aqueous solution is within the above-described range in the polishing agent.

[Organic Solvent]

The polishing agent of the present embodiment may contain an organic solvent. When the polishing agent contains the organic solvent, it is possible to further improve the wettability of the polishing agent. The organic solvent is not particularly limited, but a solvent in a liquid state at 20° C. is preferable. The solubility of the organic solvent to 100 g of water (20° C.) is preferably 30 g or more, more preferably 50 g or more, and further preferably 100 g or more, from the viewpoint of highly concentrating the polishing agent. The organic solvent can be used singly or in combination of two or more kinds thereof.

Examples of the organic solvent include carbonate esters, lactones, glycols, and derivatives of glycols. Examples of the carbonate esters include ethylene carbonate, propylene carbonate, dimethyl carbonate, diethyl carbonate, and methylethyl carbonate. Examples of the lactones include butyrolactone and propiolactone.

Examples of the glycols include ethylene glycol, propylene glycol, diethylene glycol, dipropylene glycol, triethylene glycol, and tripropylene glycol. Examples of the derivatives of glycols include glycol monoethers and glycol diethers. Examples of the glycol monoethers include ethylene glycol monomethyl ether, propylene glycol monomethyl ether, propylene glycol monomethyl ether acetate, diethylene glycol monomethyl ether, dipropylene glycol monomethyl ether, triethylene glycol monomethyl ether, tripropylene glycol monomethyl ether, ethylene glycol monoethyl ether, propylene glycol monoethyl ether, diethylene glycol monoethyl ether, dipropylene glycol monoethyl ether, triethylene glycol monoethyl ether, tripropylene glycol monoethyl ether, ethylene glycol monopropyl ether, propylene glycol monopropyl ether, diethylene glycol monopropyl ether, dipropylene glycol monopropyl ether, triethylene glycol monopropyl ether, tripropylene glycol monopropyl ether, ethylene glycol monobutyl ether, propylene glycol monobutyl ether, diethylene glycol monobutyl ether, dipropylene glycol monobutyl ether, triethylene glycol monobutyl ether, and tripropylene glycol monobutyl ether. Examples of the glycol diethers include ethylene glycol dimethyl ether, propylene glycol dimethyl ether, diethylene glycol dimethyl ether, dipropylene glycol dimethyl ether, triethylene glycol dimethyl ether, tripropylene glycol dimethyl ether, ethylene glycol diethyl ether, propylene glycol diethyl ether, diethylene glycol diethyl ether, dipropylene glycol diethyl ether, triethylene glycol diethyl ether, tripropylene glycol diethyl ether, ethylene glycol dipropyl ether, propylene glycol dipropyl ether, diethylene glycol dipropyl ether, dipropylene glycol dipropyl ether, triethylene glycol dipropyl ether, tripropylene glycol dipropyl ether, ethylene glycol dibutyl ether, propylene glycol dibutyl ether, diethylene glycol dibutyl ether, dipropylene glycol dibutyl ether, triethylene glycol dibutyl ether, and tripropylene glycol dibutyl ether. The organic solvent is preferably at least one selected from the group consisting of glycols and derivatives of glycols from the viewpoint that surface tension is low, and more preferably glycol monoethers from the viewpoint that the surface tension is further lower.

The content of the organic solvent is preferably 0.500% by mass or more and more preferably 1.000% by mass or more on the basis of the total mass of the polishing agent, from the viewpoint of suppressing the lowering of the wettability of the polishing agent with respect to a material to be polished. The content of the organic solvent is preferably 20.000% by mass or less, more preferably 15.000% by mass or less, and further preferably 10.000% by mass or less on the basis of the total mass of the polishing agent, from the viewpoint that the dispersion stability is excellent.

[Surfactant]

The polishing agent may contain a surfactant (surfactant component). When the polishing agent contains the surfactant, it is possible to easily adjust the polishing rate for a material to be polished and easily reduce polishing scratches.

Examples of the surfactant include a water-soluble anionic surfactant, a water-soluble nonionic surfactant, and a water-soluble cationic surfactant. Examples of the water-soluble anionic surfactant include ammonium lauryl sulfate, ammonium polyoxyethylene lauryl ether sulfate, alkyl phosphate ester salts, polyoxyethylene alkyl ether phosphates, and a lauroyl sarcosinate. Examples of the water-soluble nonionic surfactant include polyoxyethylene lauryl ether and polyethylene glycol monostearate. Examples of the water-soluble cationic surfactant include a hexadecyltrimethylammonium salt, a myristyltrimethylammonium salt, a lauryltrimethylammonium salt, a stearyltrimethylammonium salt, a cetyltrimethylammonium salt, a stearyltrimethylammonium salt, a distearyldimethylammonium salt, an alkylbenzyldimethyl ammonium salt, an alkylbenzyldimethyl ammonium salt, coconut amine acetate, and stearyl amine acetate. Among them, the water-soluble anionic surfactant is preferable as the surfactant. In particular, it is more preferable to use at least one water-soluble anionic surfactant such as a polymer dispersant obtained by using an ammonium salt or a tetramethylammonium salt as a copolymerization component. The surfactant can be used singly or in combination of two or more kinds thereof. The content of the surfactant is, for example, 0.0001 to 0.1% by mass on the basis of the total mass of the polishing agent.

(Others)

A method of blending each component contained in the polishing agent and a method of diluting the polishing agent are not particularly limited, and for example, each component can be dispersed or dissolved by stirring with a blade stirrer, ultrasonic dispersion, or the like. The mixing order of each component with respect to water is not limited.

The polishing agent of the present embodiment may be stored as a one-pack type polishing agent containing at least abrasive grains and water or may be stored as a multi-pack type polishing agent having a slurry (first liquid) and an additive liquid (second liquid). In the multi-pack type polishing agent, the constituent components of the polishing agent are divided into the slurry and the additive liquid such that the slurry and the additive liquid are mixed to form the polishing agent. The slurry contains, for example, at least abrasive grains and water. The additive liquid contains, for example, at least water. The additive (such as a pH adjusting agent, a chelating agent, a corrosion preventive agent, an oxidizing agent, an organic solvent, a surfactant, or an antifoaming agent) is preferably contained in the additive liquid among the slurry and the additive liquid. Incidentally, the constituent components of the polishing agent may be stored separately in three or more liquids.

In the multi-pack type polishing agent, the polishing agent may be prepared by mixing the slurry and the additive liquid immediately before polishing or during polishing. It is also acceptable to supply each of the slurry and the additive liquid of the multi-pack type polishing agent onto a polishing platen, and to polish the surface to be polished using the polishing agent obtained by mixing the slurry and the additive liquid on the polishing platen.

<Stock Solution for Polishing Agent>

The stock solution for a polishing agent of the present embodiment is a stock solution for obtaining the polishing agent and the stock solution for a polishing agent is diluted with water to obtain the polishing agent. The stock solution for a polishing agent is stored in such a state that the amount of water is more reduced than that during use, and can be used as the polishing agent by being diluted with water before use or during use. The stock solution for a polishing agent is different from the polishing agent in such a point that the content of water is smaller than that in the polishing agent. The dilution ratio is, for example, 1.5 times or more.

<Polishing Method>

The polishing method of the present embodiment includes a polishing step of polishing (CMP or the like) and removing at least a part of a silicon oxide film by using the polishing agent. In the polishing step, a surface to be polished containing the silicon oxide film can be polished. In the polishing step, at least a part of a silicon oxide film of a base substrate having the silicon oxide film can be polished and removed by using the polishing agent. The silicon oxide film may contain at least one selected from the group consisting of a TEOS film and a $SiH_4$ film. The base substrate may have, for example, a film formed on a substrate having a concave portion and a convex portion on the surface. The base substrate may be, for example, a wiring board or a circuit board. The base substrate is not limited to a base substrate in which only a silicon oxide film is formed on the entire surface of a substrate, and may be a base substrate further having a silicon nitride film, a polycrystal silicon film, or the like in addition to a silicon oxide film on a substrate surface. In addition, the polishing method can also be applied to a base substrate in which a silicon oxide film; an inorganic insulating film such as glass or silicon nitride; a film mainly containing polysilicon, Al, Cu, Ti, TiN, W, Ta, TaN, or the like; or the like is formed on a wiring board having a predetermined wiring.

Examples of a method for forming a silicon oxide film include a low-pressure CVD method and a plasma CVD method. The formation of a silicon oxide film by the low-pressure CVD method can use monosilane ($SiH_4$) as a Si source and oxygen ($O_2$) as an oxygen source. A silicon oxide film is formed by performing this $SiH_4$—$O_2$-based oxidation reaction at a low temperature of 400° C. or lower. According to circumstances, a thermal treatment is performed at a temperature equal to or lower than 1000° C. after CVD.

The plasma CVD method has an advantage of allowing a chemical reaction that requires high temperature at normal thermal equilibrium to take place at low temperature. Plasma generation methods include two types of capacitive coupling and inductive coupling. Examples of the reactive gas include a $SiH_4$—$N_2O$-based gas with $SiH_4$ as a Si source and $N_2O$ as an oxygen source, and a TEOS-$O_2$-based gas with tetraethoxysilane (TEOS) as a Si source (TEOS-plasma CVD method). The substrate temperature is preferably in a range of 250 to 400° C. and the reaction pressure is preferably in a range of 67 to 400 Pa.

The silicon oxide film may be doped with phosphorus (P) in order to achieve surface flattening with high-temperature reflow. In this case, a $SiH_4$—$O_2$—$PH_3$-based reactive gas is preferably used. In this way, the silicon oxide film to be polished may be doped with an element such as phosphorus or boron.

The polishing step may be a step of polishing and removing at least a part of a silicon oxide film by using a one-pack type polishing agent, a step of polishing and removing at least a part of a silicon oxide film by using a polishing agent obtained by mixing a slurry and an additive liquid of a multi-pack type polishing agent, or a step of polishing and removing at least a part of a silicon oxide film by using a polishing agent obtained by diluting the stock solution for a polishing agent with water.

In the polishing step, a base substrate provided having a metallic material in addition to a silicon oxide film may be polished.

In the case of using the multi-pack type polishing agent, the polishing method of the present embodiment may include a polishing agent preparation step of mixing the slurry and the additive liquid of the multi-pack type polishing agent to obtain a polishing agent, before the polishing step. In the case of using the stock solution for a polishing agent, the polishing method of the present embodiment may include a polishing agent preparation step of diluting the stock solution for a polishing agent with water to obtain a polishing agent, before the polishing step.

In the polishing step, for example, the surface to be polished of the base substrate is polished by relatively moving the base substrate with respect to a polishing platen in such a state that the surface to be polished is pressed against a polishing cloth (polishing pad) of the polishing platen, the polishing agent is supplied between the surface to be polished and the polishing cloth, and a predetermined pressure is applied to the rear face (surface opposite to surface to be polished) of the base substrate.

As a polishing apparatus, for example, it is possible to use a general polishing apparatus which has a platen to which a motor that can change the number of revolutions or the like is attached and on which a polishing cloth also can be mounted; and a holder which holds the base substrate. The polishing cloth is not particularly limited, but a general nonwoven fabric, foamed polyurethane, a porous fluororesin, and the like can be used. The polishing condition is not particularly limited, but the rotational speed of the platen is preferably a low rotation of 200 times/min or less from the viewpoint of suppressing flying-off of the base substrate. For example, while polishing, the polishing agent is continuously supplied to the polishing cloth with a pump or the like. The amount of the polishing agent to be supplied is not limited, but it is preferable that the surface of the polishing cloth is always covered with the polishing agent and a product produced by a progress of polishing is continuously discharged.

In order to carry out the polishing while always keeping the surface state of the polishing cloth constant, it is preferable that the polishing method of the present embodiment includes a conditioning step of a polishing cloth before the polishing step. For example, the conditioning of the polishing cloth is performed with a liquid containing at least water, while using a dresser to which diamond particles attach. It is preferable that the polishing method of the present embodiment includes a base substrate cleaning step after the cleaning step. It is preferable to sufficiently wash the base substrate after completion of polishing in running water, then perform drying after removing droplets, which have attached onto the base substrate, using a spin dry or the like. In addition, it is more preferable to perform a cleaning with a known cleaning method of removing the deposits on the base substrate by pressing a brush made from a polyvinyl alcohol-based resin against the base substrate with a constant pressure while letting a commercially available cleaning liquid flow on the surface of the base substrate and rotating the brush, and then perform a drying.

The polishing rate for the TEOS film is preferably 50 nm/min or more, more preferably 70 nm/min or more, and further preferably 100 nm/min or more, from the viewpoint of shortening the polishing time. The polishing rate for the TEOS film is preferably 1000 nm/min or less and more preferably 500 nm/min or less, from the viewpoint that the progress of excessive polishing for the concave portion of the TEOS film, the wiring metal, or the like is suppressed to further improve the flatness, and the viewpoint that it is easy to adjust the polishing time.

The polishing rate for the $SiH_4$ film is preferably 15 nm/min or more and more preferably 20 nm/min or more, from the viewpoint of shortening the polishing time. The polishing rate for the $SiH_4$ film is preferably 1000 nm/min or less and more preferably 500 nm/min or less, from the viewpoint that the progress of excessive polishing for the concave portion of the TEOS film, the wiring metal, or the like is suppressed to further improve the flatness, and the viewpoint that it is easy to adjust the polishing time.

EXAMPLES

Hereinafter, the present invention will be described in more detail by means of examples, but the present invention is not limited to these examples unless deviating from the technological idea of the present invention. For example, the types and the blending ratios of the materials of the polishing agent may be types and ratios other than the types and the ratios described in the present examples, and the composition and the structure of the object to be polished may also be compositions and structures other than the compositions and the structures described in the present examples.

<Preparation of Polishing Agent>

Example 1

After malonic acid (pH adjusting agent) was poured to 5.00 parts by mass of abrasive grains (colloidal silica 1) such that the pH of the polishing agent became 2.5, X parts by mass of ultrapure water was poured to obtain 100 parts by mass of a polishing agent. Incidentally, the blended amount of the ultrapure water (X parts by mass) was calculated and adjusted such that the polishing agent became 100 parts by mass.

Examples 2 and 3 and Comparative Examples 1 to 6

Polishing agents were prepared by the same method as in Example 1, except that the types of abrasive grains (colloidal silica 2 to 9) were changed as shown in Table 1.

Comparative Example 7

10.00 parts by mass of abrasive grains (colloidal silica 1) were charged into a container. Next, after KOH and malonic acid were poured such that the pH of the polishing agent became 10.0, X parts by mass of ultrapure water was poured to obtain 100 parts by mass of a polishing agent. Incidentally, the blended amount of the ultrapure water (X parts by mass) was calculated and adjusted such that the polishing agent became 100 parts by mass.

<Measurement of Particle Diameter of Abrasive Grains>

The average particle diameter $R_{ave}$ of the abrasive grains in the polishing agent was measured using a dynamic light scattering type particle size distribution meter (trade name: COULTER N4SD manufactured by Coulter Electronics, Inc.). The result is shown in Table 1.

The average minor diameter $R_{min}$ of the abrasive grains in the polishing agent was measured using a transmission electron microscope (trade name: H-7100FA manufactured by Hitachi, Ltd.). Images of the abrasive grains were captured using the transmission electron microscope and the shortest distance among distances connecting end parts of the images of particles for each of images of ten particles (which each are one independent primary particle) was obtained as the minor diameter. Then, an average value of ten minor diameters was obtained as the average minor diameter $R_{min}$. In addition, the ratio $R_{ave}/R_{min}$ was calculated. The results are shown in Table 1.

<Measurement of Zeta Potential>

The zeta potential of the abrasive grains in the polishing agent was measured as described below. As for a zeta potential measuring apparatus, trade name: DELSA NANO C manufactured by Beckman Coulter, Inc. was used. A sample was obtained by diluting the polishing agent with pure water such that the scattering intensity of a measurement sample became $1.0 \times 10^4$ to $5.0 \times 10^4$ cps in the zeta potential measuring apparatus. Thereafter, the obtained sample was charged into a cell for measuring a zeta potential, and the zeta potential was measured. The results are shown in Table 1.

<Measurement of pH of Polishing Agent>

A pH of the polishing agent was measured under the following conditions. The results are shown in Table 1.

Measurement temperature: 25±5° C.

Measuring apparatus: trade name: Model (F-51) of HORIBA, Ltd.

Measurement method: after calibrating a pH meter by three points using a pH standard solution (pH: 4.01) of a phthalate, a pH standard solution (pH: 6.86) of a neutral phosphate, and a pH standard solution (pH: 9.18) of a borate as pH standard solutions, putting an electrode of the pH meter in the polishing agent, and measuring the pH with the above-described measuring apparatus at the time after 2 min or longer elapsed and the pH became stable.

<Evaluation of Polishing Rate>

As a base substrate having a film to be polished, a base substrate which has a TEOS film having a film thickness of 500 nm on a silicon substrate and a base substrate which has a $SiH_4$ film having a film thickness of 200 nm were used. The base substrate was cut into a 20-mm square chip to prepare a chip for evaluation. The film to be polished of the chip for evaluation was chemically-mechanically polished for 60 seconds under the following polishing conditions using the polishing agent prepared above.

[Polishing Conditions]

Polishing apparatus: bench polisher (trade name: IMPT-ECH 10 DVT manufactured by Engis Japan Corporation)

Polishing cloth: polishing cloth made of suede-like foamed polyurethane resin

Number of revolutions of platen: 120 times/min

Polishing pressure: 33 kPa

Amount of polishing agent to be supplied: 10 mL/min

Distilled water was supplied for 30 seconds to the polished surface of the base substrate polished under the above-described polishing conditions. Finally, a nitrogen gun was applied to the base substrate to flick the distilled water so as to dry the base substrate.

The polishing rate was calculated from a film thickness difference obtained by measuring film thicknesses of a film to be polished before and after polishing. In measurement of film thicknesses of the TEOS film and the $SiH_4$ film, a film thickness measuring apparatus (trade name: NanoSpac manufactured by Nanometrics Incorporated) was used. Five points in a chip for evaluation were arbitrarily selected, and an average value thereof was calculated as a film thickness. The measurement results of the polishing rate are shown in Table 1.

TABLE 1

| | | | Average particle diameter (Rave) | Average minor diameter (Rmin) | Rave/Rmin ratio | pH adjusting agent | Zeta potential | pH | TEOS polishing rate | $SiH_4$ polishing rate |
|---|---|---|---|---|---|---|---|---|---|---|
| Unit | Silica particles | Particle content % by mass | nm | nm | — | — | mV | — | nm/min | nm/min |
| Example 1 | Colloidal silica 1 | 5 | 52 | 46 | 1.13 | Malonic acid | 13 | 2.5 | 78 | 20 |
| Example 2 | Colloidal silica 2 | 5 | 96 | 86 | 1.12 | Malonic acid | 13 | 2.5 | 112 | 21 |
| Example 3 | Colloidal silica 3 | 5 | 70 | 41 | 1.71 | Malonic acid | 10 | 2.5 | 50 | 24 |
| Comparative Example 1 | Colloidal silica 4 | 5 | 62 | 30 | 2.07 | Malonic acid | 25 | 2.5 | 81 | 4 |
| Comparative Example 2 | Colloidal silica 5 | 5 | 42 | 31 | 1.35 | Malonic acid | 12 | 2.5 | 72 | 11 |
| Comparative Example 3 | Colloidal silica 6 | 5 | 30 | 24 | 1.25 | Malonic acid | 12 | 2.5 | 55 | 5 |
| Comparative Example 4 | Colloidal silica 7 | 5 | 66 | 40 | 1.65 | Malonic acid | −20 | 2.5 | 9 | 65 |
| Comparative Example 5 | Colloidal silica 8 | 5 | 51 | 23 | 2.22 | Malonic acid | 13 | 2.5 | 83 | 4 |
| Comparative Example 6 | Colloidal silica 9 | 5 | 45 | 26 | 1.73 | Malonic acid | 10 | 2.5 | 110 | 8 |
| Comparative Example 7 | Colloidal silica 1 | 10 | 51 | 45 | 1.13 | KOH Malonic acid | −30 | 10.0 | 31 | 31 |

As shown in Table 1, it is found that in Examples, as compared to Comparative Examples, the TEOS film and the $SiH_4$ film can be removed at a high polishing rate.

The invention claimed is:

1. A polishing agent comprising:
   abrasive grains, and
   water,
   wherein the abrasive grains contain silica particles,
   an average secondary particle diameter $R_{ave}$ of the abrasive grains is 50 nm or more,
   a ratio $R_{ave}/R_{min}$ of the average secondary particle diameter $R_{ave}$ to an average minor diameter $R_{min}$ of the abrasive grains is 1.0 to 1.3, and
   a zeta potential of the abrasive grains in the polishing agent is positive.

2. The polishing agent according to claim 1, wherein the silica particles contain colloidal silica.

3. The polishing agent according to claim 1, wherein the average secondary particle diameter $R_{ave}$ is 50 to 100 nm.

4. The polishing agent according to claim 1, wherein the average secondary particle diameter $R_{ave}$ exceeds 60 nm.

5. The polishing agent according to claim 1, wherein the ratio $R_{ave}/R_{min}$ is 1.1 to 1.3.

6. The polishing agent according to claim 1, further comprising a pH adjusting agent.

7. The polishing agent according to claim 1, wherein a pH is 2.0 to 4.0.

8. A stock solution for a polishing agent for obtaining the polishing agent according to claim 1,
   wherein the stock solution is diluted with water to obtain the polishing agent.

9. The polishing agent according to claim 1, wherein the average secondary particle diameter $R_{ave}$ is more than 70 nm.

10. The polishing agent according to claim 1, wherein the average secondary particle diameter $R_{ave}$ is 80 nm or more.

11. The polishing agent according to claim 1, wherein the zeta potential of the abrasive grains is 20 mV or less.

12. The polishing agent according to claim 1, wherein the average secondary particle diameter $R_{ave}$ and the ratio $R_{ave}/R_{min}$ are values of all silica particles contained in the polishing agent.

13. A polishing method comprising a step of polishing and removing at least a part of a silicon oxide film by using the polishing agent according to claim 1.

14. The polishing method according to claim 13, wherein the silicon oxide film comprises at least one selected from the group consisting of a TEOS film and a $SiH_4$ film.

15. The polishing method according to claim 13, wherein the silicon oxide film comprises a TEOS film.

16. The polishing method according to claim 13, wherein the silicon oxide film comprises a $SiH_4$ film.

17. A polishing method comprising a step of polishing and removing at least a part of a silicon oxide film by using the polishing agent obtained by diluting the stock solution for a polishing agent according to claim 8 with water.

18. The polishing method according to claim 17, wherein the silicon oxide film comprises at least one selected from the group consisting of a TEOS film and a $SiH_4$ film.

19. The polishing method according to claim 17, wherein the silicon oxide film comprises a TEOS film.

20. The polishing method according to claim 17, wherein the silicon oxide film comprises a $SiH_4$ film.

21. A polishing agent comprising:
    abrasive grains, and water,
wherein the abrasive grains contain silica particles,
an average secondary particle diameter $R_{ave}$ of the abrasive grains is 50 nm or more,
a ratio $R_{ave}/R_{min}$ of the average secondary particle diameter $R_{ave}$ to an average minor diameter $R_{min}$ of the abrasive grains is 1.71 to 2.0, and
a zeta potential of the abrasive grains in the polishing agent is positive.

22. The polishing agent according to claim 21, wherein the average secondary particle diameter $R_{ave}$ and the ratio $R_{ave}/R_{min}$ are values of all silica particles contained in the polishing agent.

* * * * *